United States Patent [19]

Aleksa et al.

[11] Patent Number: 4,745,376
[45] Date of Patent: May 17, 1988

[54] FAULT TOLERANT OSCILLATOR CIRCUIT HAVING REDUNDANT RESONANT ELEMENTS

[75] Inventors: Robert J. Aleksa; Carl L. Shore, both of Glendale; Richard Hobby, Peoria, all of Ariz.

[73] Assignee: Honeywell Inc., Minneapolis, Minn.

[21] Appl. No.: 11,802

[22] Filed: Feb. 6, 1987

[51] Int. Cl.<sup>4</sup> ............................................... H03B 5/32
[52] U.S. Cl. .................................... 331/162; 331/160
[58] Field of Search ............. 331/116 R, 116 FE, 158, 331/159, 160, 161, 162, 164

[56] References Cited

U.S. PATENT DOCUMENTS

| 1,915,368 | 6/1933 | Lack | 331/162 X |
| 3,358,244 | 12/1967 | Er-Chun Ho et al. | 331/162 X |
| 4,575,690 | 3/1986 | Walls et al. | 331/162 |

FOREIGN PATENT DOCUMENTS 55-110981  8/1980  Japan .................................. 331/162

Primary Examiner—Siegfried H. Grimm
Attorney, Agent, or Firm—Seymour Levine; Albin Medved

[57] ABSTRACT

An oscillator having a multiplicity of resonant structures parallel coupled to form a fault tolerant resonator in the feedback circuit of the oscillator. This fault tolerant resonator permits the oscillator to operate in a near fault free manner after the failure of one or more of the resonant structures.

3 Claims, 1 Drawing Sheet

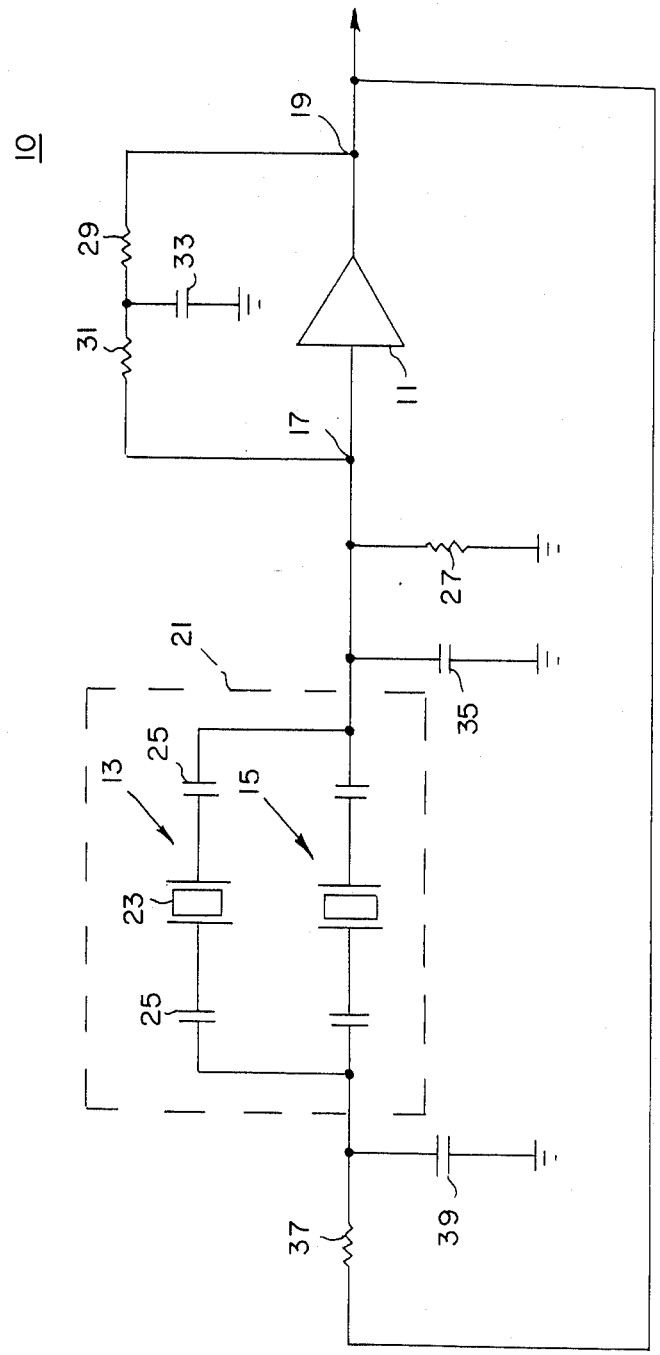

FAULT TOLERANT OSCILLATOR CIRCUIT HAVING REDUNDANT RESONANT ELEMENTS

BACKGROUND OF THE INVENTION

1. Field of the Invention

The invention pertains to the field of self-sustained oscillators, and more particularly to oscillators of high reliability being capable of sustaining oscillations after a component failure.

2. Description of the Prior Art

An oscillator is an amplifier with feedback circuitry which provides 360 degrees of phase shift to the output signal and couples the phase-shifted signal to the input port of the amplifier. When this circuit provides sufficient regenerative feedback the amplifier becomes unstable and begins to oscillate at a frequency determined by the resonant characteristics of the feedback circuit. Should an element in this feedback circuit fail, the oscillator fails. To maintain the desired oscillator output signal after a component failure the prior art utilizes multiple phase locked loops to control the oscillations. Should one or more loops fail, the output characteristics of the oscillator are maintained by the remaining operating phase locked loops. This technique requires extensive circuitry, occupies an appreciable area on a circuit board, consumes an appreciable amount of power, and is expensive to implement.

Since oscillator failure is caused by the breakdown of a component in the oscillator circuit, a desired level of reliability may be achieved by providing failure compensation only for those components in the circuit having relatively high failure rates. This greatly reduces the complexity, size, and cost of an oscillator circuit for a desired level of reliability.

SUMMARY OF THE INVENTION

A high reliability oscillator circuit constructed in accordance with the principles of the present invention includes redundant resonant elements in the oscillator's feedback circuit. These elements are coupled in parallel to permit continued operation of the oscillator, with but an acceptable minor frequency shift, should a resonant element fail. A resistor-capacitor network is coupled around the amplifier to provide sufficient negative feedback to prevent oscillations when the parallel resonant elements are removed from the oscillator circuit.

BRIEF DESCRIPTION OF THE DRAWING

The sole FIGURE is a schematic diagram of a preferred embodiment of the invention.

DESCRIPTION OF THE PREFERRED EMBODIMENT

Referring to the FIGURE an oscillator 10 constructed in accordance with the principles of the invention includes an amplifier 11 having resonant structures 13 and 15 coupled in parallel between the input port 17 and output port 19 of the amplifier 11. This parallel combination establishes a fault tolerant resonator 21 which controls the oscillating frequency of the system. The resonant structures 13, 15 may resonate at the same frequency and each may include a crystal 23 and isolation capacitors 25. The isolation capacitors may be varied to tune the resonant structures for desired oscillator operation. Though only two resonant structures are shown in the FIGURE, it should be apparent to those skilled in the art that additional resonant structures may be added, should greater reliability be desired.

A resistor 27 is coupled to the input port 17. When the amplifier is turned on, current flows through this resistor to establish a bias required for linear amplifier operation. A RC circuit including series resistors 29, 31 and shunt capacitor 33 coupled at the junction of the resistors 29, 31 is included in the feedback circuit. Capacitor 33 is of sufficiently large value to establish a very low impedance at the oscillator frequency, thereby establishing resistor 29 as a load on the amplifier and resistor 31 as a shunt across the input resistor 27 during the oscillator operation. This decouples the RC network from the feedback circuit during the oscillator operator while providing negative DC feedback to prevent oscillation when the fault tolerant resonator is removed from the system.

To establish the required 360 degree phase shift in the feedback circuit, the resonator stage, comprising the fault tolerant resonator 21 and the parallel circuit of resistors 27 and 31 with capacitor 35, must provide between 90 degrees and 180 degrees of phase shift. This phase shift is apportioned between the fault tolerant resonator structure 21 and parallel RC circuit 27, 31, 35 to provide a compromise between long term and short term oscillator stability. The closer the phase shift of this resonator stage is to 90 degrees the smaller is the value of the capacitor 35. This condition provides long term frequency stability by decreasing the crystals drive level at the expense, however, of decreasing the loaded "Q" of the circuit, thereby degrading the short term frequency stability. When the phase shift through the resonator stage is near 180 degrees, the capacitance value of capacitor 35 is relatively large. This condition increases the loaded "Q" of the circuit, providing an increase in short term frequency stability at the expense of increasing the drive level of the crystal, thereby adversely affecting the long term frequency stability.

The phase shift difference between 360 degrees and that provided by the amplifier 11 and resonator stage 21, 27, 31, 35 combination is added to the feedback circuit by the series combination of resistor 37 and capacitor 39. The value of the resistor 37 is determined by the output voltage of the amplifier and the maximum AC current that may be drawn by the crystals and amplifier. After this resistance value is determined, the capacitance value of capacitor 39 is then chosen to provide the added phase shift required.

Though the preferred embodiment utilizes a Pierce oscillator configuration, those skilled in the art will recognize that the technique may be applied to other oscillator circuits, as for example Colpitts, Miller, Butler, and Hartley. It is to be understood that the words which have been used are words of description rather than limitation and that changes may be made within the purview of the appended claims without departing from the true scope and spirit of the invention in its broader aspects.

We claim:

1. An oscillating apparatus comprising:
   an amplifier having an input port and an output port; and
   at least two resonant structures, each comprising a series circuit including a crystal coupled between first and second series capacitors, said resonant structures coupled to form a parallel circuit, said parallel circuit having a first terminal coupled to said input port and a second terminal coupled to said output port, whereby a signal at said output port oscillates in accordance with resonant characteristics of said parallel circuit.

2. An oscillating apparatus in accordance with claim 1 further including;

a parallel combination of a first resistor and a first capacitor coupled to said input port;

a second resistor coupled between said output port and said second terminal; and a capacitor coupled to said second terminal.

3. An oscillating apparatus in accordance with claim 2 further including third and fourth resistors serially coupled between said input port and said output port with a node therebetween and a third capacitor coupled to said node.

* * * * *